United States Patent
McCollum et al.

(10) Patent No.: US 8,570,819 B2
(45) Date of Patent: Oct. 29, 2013

(54) NON-VOLATILE MEMORY ARRAY ARCHITECTURE OPTIMIZED FOR HI-RELIABILITY AND COMMERCIAL MARKETS

(75) Inventors: John McCollum, Saratoga, CA (US); Fethi Dhaoui, Mountain House, CA (US)

(73) Assignee: Actel Corporation, San Jose, CA (US)

( * ) Notice: Subject to any disclaimer, the term of this patent is extended or adjusted under 35 U.S.C. 154(b) by 76 days.

(21) Appl. No.: 13/416,192

(22) Filed: Mar. 9, 2012

(65) Prior Publication Data

US 2013/0235678 A1  Sep. 12, 2013

(51) Int. Cl.
*G11C 7/00* (2006.01)
*G11C 7/06* (2006.01)

(52) U.S. Cl.
CPC .................................... *G11C 7/06* (2013.01)
USPC ...... 365/196; 365/207; 365/190; 365/189.02; 365/189.08; 365/202

(58) Field of Classification Search
CPC ............... G11C 11/406; G11C 7/1051; G11C 11/4091; G11C 7/065; G11C 7/18; G11C 13/004
USPC ............... 365/207, 190, 189.02, 189.08, 202, 365/189.09, 196
See application file for complete search history.

(56) References Cited

U.S. PATENT DOCUMENTS

| 2001/0012228 A1 | 8/2001 | Perner |
| 2007/0247939 A1 | 10/2007 | Nahas et al. |
| 2009/0097327 A1* | 4/2009 | Avramescu et al. ..... 365/189.02 |
| 2009/0273980 A1 | 11/2009 | Doyle |
| 2011/0141814 A1 | 6/2011 | Abiko |

OTHER PUBLICATIONS

International Search Report and Written Opinion in corresponding International Patent Application No. PCT/US2013/028936 filed Mar. 4, 2013, 10 pages.

* cited by examiner

*Primary Examiner* — Thong Q Le
(74) *Attorney, Agent, or Firm* — Lewis Roca Rothgerber LLP

(57) ABSTRACT

A sense amplifier arrangement includes a first sense amplifier having a first input and a second input. A second sense amplifier has a first input and a second input. A switching circuit is configured to selectively couple the first input of the first sense amplifier to a first bit line in the array and the second input of the first sense amplifier to a first bit line in the array to selectively couple the first input of the first sense amplifier to the first bit line in the array, the first input of the second sense amplifier to the second bit line in the array, and the second inputs of the first and second sense amplifiers to a reference voltage.

12 Claims, 8 Drawing Sheets

NON-VOLATILE MEMORY ARRAY ARCHITECTURE OPTIMIZED FOR HI-RELIABILITY AND COMMERCIAL MARKETS

BACKGROUND

1. Field of the Invention

The present invention relates to integrated circuits and to integrated circuit non-volatile memory array architectures. More particularly, the present invention relates to non-volatile memory array architectures that can be optimized for high-reliability and commercial markets.

2. The Prior Art

It is advantageous to use complimentary non-volatile memory cell designs for high temperature and radiation-tolerant markets because the signal is twice as large as single ended cells and noise components become common mode, allowing weak memory cells to be reliably sensed. The problem is that if it is desired to use the same design in a commercial product the memory density is only half that of conventional single-ended commercial non-volatile memory array products and is therefore more expensive. This problem has not been previously solved.

BRIEF DESCRIPTION

According to one aspect of the present invention, a non-volatile memory array is arranged as a plurality of rows and columns of non-volatile memory cells, memory cells in each column of the array being selectively coupleable to a bit line associated with that column of the array. A memory cell sensing circuit includes a first sense amplifier arrangement coupleable to the memory array to differentially read a complementary bit stored in a pair of memory cells and a second sense amplifier arrangement coupleable to the memory array to read a single-ended bit stored in a single memory cell. The first and second sense amplifier arrangements are selectively coupled to the memory array in response to at least one selection signal.

In one embodiment, in the first sense amplifier arrangement the first sense amplifier has its first input coupled to a first bit line and its second input coupled to a second bit line in response to a first state of the at least one selection signal. In the second sense amplifier arrangement the first sense amplifier has its first input coupled to a first bit line and its second input coupled to a reference voltage in response to a second state of the at least one selection signal and a second sense amplifier has a first input coupled to a second bit line and a second input coupled to the reference voltage in response to the second state of the at least one selection signal.

In another embodiment, in the first sense amplifier arrangement the first sense amplifier has its first input coupled to a first bit line and its second input coupled to a second bit line in response to a first state of the at least one selection signal. In the second sense amplifier arrangement, a second sense amplifier has a first input coupled to the first bit line and a second input coupled to the reference voltage, and a third sense amplifier has a first input coupled to the second bit line and a second input coupled to the reference voltage in response to the second state of the at least one selection signal.

In yet another embodiment, in the first sense amplifier arrangement the first sense amplifier has its first input coupled to a first bit line and its second input coupled to a second bit line in response to a first state of the at least one selection signal. In the second sense amplifier arrangement, the first sense amplifier has its first input coupled to the first bit line and the second input coupled to a reference voltage for a first period of time, and has its first input coupled to the reference voltage and the second input coupled to the second bit line for a second period of time in response to a second state of the at least one selection signal.

In accordance with a method of the present invention, a pair of memory cells in a row and associated with two adjacent columns in the array. First and second modes of operation can be selected. In the first mode of operation the pair of memory cells are programmed with complementary data as a single bit. The bit line associated with the first column of the adjacent pair of columns is coupled to the first input of a sense amplifier and the bit line associated with the second column of the adjacent pair of columns is coupled to the second input of the sense amplifier. The word line for the row is asserted and the complementary data read out to the sense amplifier on the bit lines associated with the adjacent columns. In the second mode of operation, the pair of memory cells are individually programmed with data. The bit line associated with the first column of the two adjacent columns is coupled to the first input of a sense amplifier and a reference voltage is coupled to the second input of the sense amplifier. The word line for the row is asserted and the data from the memory cell in the first column is read out to the sense amplifier. The reference voltage is then coupled to the first input of the sense amplifier and the bit line associated with the second column of the two adjacent columns is coupled to the second input of a sense amplifier. The word line for the row is asserted and the data from the memory cell in the second column is read out to the sense amplifier.

In accordance with another method of the present invention, a pair of memory cells in a row and associated with two adjacent columns in the array. First and second modes of operation can be selected. In the first mode of operation the pair of memory cells are programmed with complementary data as a single bit. The bit line associated with the first column of the adjacent pair of columns is coupled to the first input of a first sense amplifier and the bit line associated with the second column of the adjacent pair of columns is coupled to the second input of the first sense amplifier. The word line for the row is asserted and the complementary data read out to the first sense amplifier on the bit lines associated with the adjacent columns. In the second mode of operation, the pair of memory cells are individually programmed with data. The bit line associated with the first column of the two adjacent columns is coupled to the first input of a first sense amplifier and a reference voltage is coupled to the second input of the first sense amplifier. The bit line associated with the second column of the two adjacent columns is coupled to a first input of a second sense amplifier. The word line for the row is asserted and the data from the memory cell in the first column is read out to the first sense amplifier and the data from the memory cell in the second column is read out to the second sense amplifier.

In accordance with another method of the present invention, a pair of memory cells in a row and associated with two adjacent columns in the array. First and second modes of operation can be selected. In the first mode of operation the pair of memory cells are programmed with complementary data as a single bit. The bit line associated with the first column of the adjacent pair of columns is coupled to the first input of a first sense amplifier and the bit line associated with the second column of the adjacent pair of columns is coupled to the second input of the first sense amplifier. The word line for the row is asserted and the complementary data read out to the first sense amplifier on the bit lines associated with the adjacent columns. In the second mode of operation, the each memory cell in the pair of memory cells is independently programmed with data. The bit line associated with the first column of the two adjacent columns is coupled to the first input of the second sense amplifier and a reference voltage is coupled to the second input of the second sense amplifier. The bit line associated with the second column of the two adjacent columns is coupled to a first input of the third sense amplifier and a reference voltage is coupled to the second input of the third sense amplifier. The word line for the row is asserted and the data from the memory cell in the first column is read out to the second sense amplifier and the data from the memory cell in the second column is read out to the third sense amplifier.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

Figure 1:
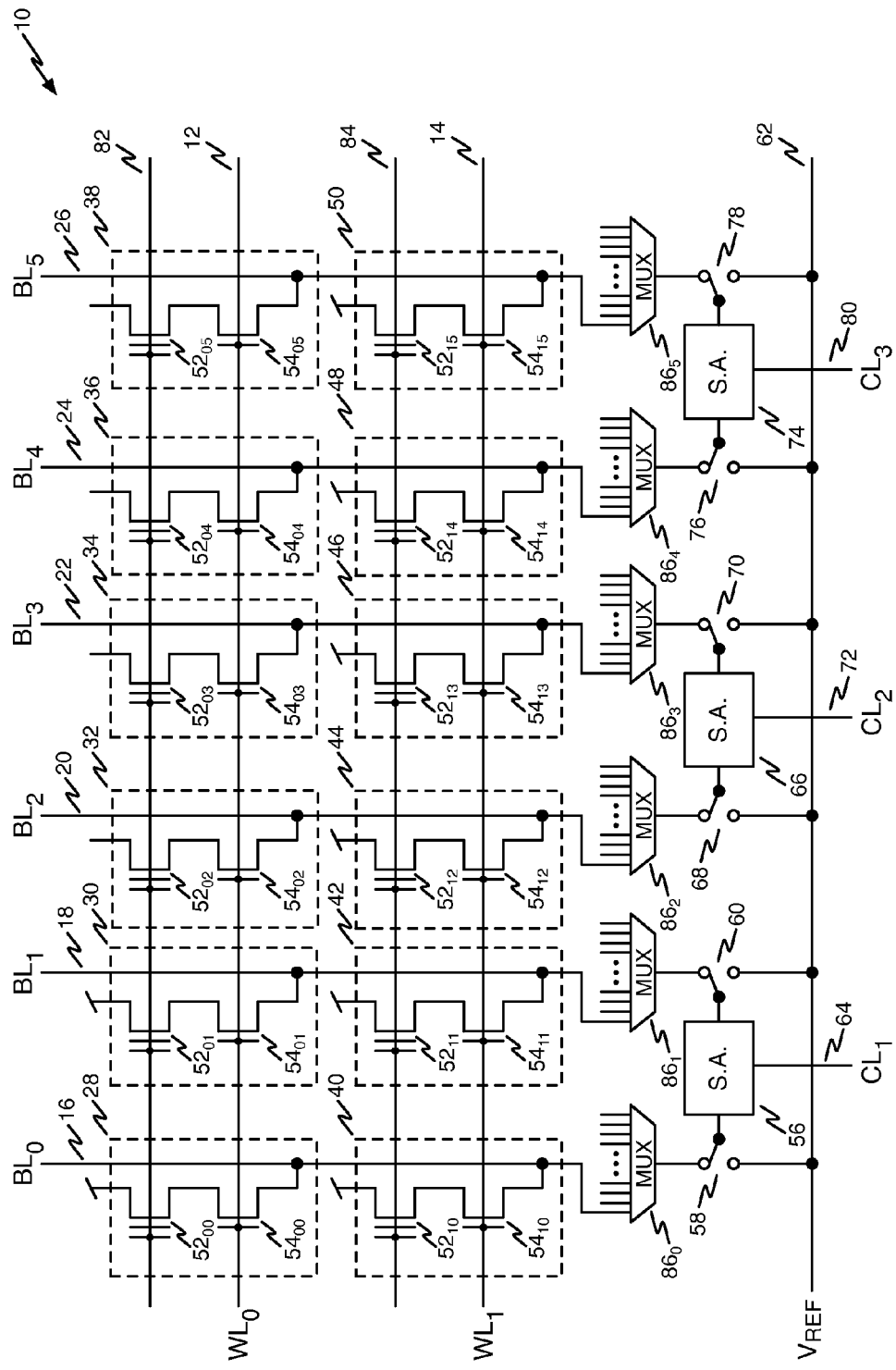
FIG. 1 is a diagram of an illustrative embodiment of a memory-array architecture according to one aspect of the present invention configured differentially for high-reliability applications.

Referring first to FIG. 1 an illustrative example of a non-volatile memory array 10 according to one aspect of the present invention is shown. The array 10 is configured as a plurality of rows and columns with a memory cell at the intersection of each row and column. Persons of ordinary skill in the art will appreciate that two rows and six columns are shown in FIG. 1 for purposes of illustrating the invention, and memory arrays of arbitrary size are contemplated in accordance with the invention.

A first word line ($WL_0$) 12 is associated with a first row of the array and a second word line ($WL_1$) 14 is associated with a second row of the array. A first bit line ($BL_0$) 16 is associated with a first column of the array. A second bit line ($BL_1$) 18 is associated with a second column of the array. A third bit line ($BL_2$) 20 is associated with a third column of the array. A fourth bit line ($BL_3$) 22 is associated with a fourth column of the array. A fifth bit line ($BL_4$) 24 is associated with a fifth column of the array. A sixth bit line ($BL_5$) 26 is associated with a sixth column of the array.

A memory cell is disposed at each row and column intersection. The first row of the array includes memory cells 28, 30, 32, 34, 36, and 38. The second row of the array includes memory cells 40, 42, 44, 46, 48, and 50. The first column of the array includes memory cells 28 and 40; the second column of the array includes memory cells 30 and 42; the third column of the array includes memory cells 32 and 44; the fourth column of the array includes memory cells 34 and 46; the fifth column of the array includes memory cells 36 and 48 and the sixth column of the array includes memory cells 38 and 50.

Each memory cell includes a pair of NMOS transistors. A first transistor $52_{XY}$ (where X and Y denote the row and column position) is a non-volatile transistor having its drain coupled to $V_{DD}$. The first transistor is connected in series with a volatile NMOS select transistor $54_{XY}$ (where X and Y denote the row and column position) having its drain coupled to the source of the non-volatile transistor $52_{XY}$, its source coupled to the bit line of the column with which it is associated and its gate coupled to the word line of the row with which it is associated.

A differential sense amplifier 56 is associated with the first two columns in the array. The first input of the sense amplifier 56 is coupled to a first switch 58 that can connect the first input to the bit line 16 or to a reference voltage line 62. The second input of the sense amplifier 56 is coupled to a second switch 60 that can connect the second input to the bit line 18 or to the reference voltage line 62. The output of the sense amplifier 56 drives a column output line ($CL_1$) 64.

Similarly, a differential sense amplifier 66 is associated with the third and fourth columns in the array. The first input of the sense amplifier 66 is coupled to a first switch 68 that can connect the first input to the bit line 20 or to the reference voltage line 62. The second input of the sense amplifier 66 is coupled to a second switch 70 that can connect the second input to the bit line 22 or to the reference voltage line 62. The output of the sense amplifier 66 drives a column output line ($CL_2$) 72.

A differential sense amplifier 74 is associated with the fifth and sixth columns in the array. The first input of the sense amplifier 74 is coupled to a first switch 76 that can connect the first input to the bit line 24 or to the reference voltage line 62. The second input of the sense amplifier 74 is coupled to a second switch 78 that can connect the second input to the bit line 26 or to the reference voltage line 62. The output of the sense amplifier 74 rives a column output line ($CL_3$) 80. Persons of ordinary skill in the art will appreciate that sense amplifiers 56, 66, and 74 may be conventional sense amplifiers used for reading the contents of non-volatile memory cells.

The memory array of FIG. 1 is shown configured as a high-reliability memory array. Switches 58 and 60 are set to connect the first and second inputs of the sense amplifier 56 to bit lines 16 and 18 to couple the sense amplifier 56 as a differential sense amplifier reading a differential bit stored in memory cell pair 28 and 30 in the first row of the array or a differential bit stored in memory cell pair 40 and 42 in the second row of the array. Switches 68 and 70 are set to connect the first and second inputs of the sense amplifier 66 to bit lines 20 and 22 to couple the sense amplifier 66 as a differential sense amplifier reading a differential bit stored in memory cell pair 32 or 34 in the first row of the array or a differential bit stored in memory cell pair 44 and 46 in the second row of the array. Switches 76 and 78 are set to connect the first and second inputs of the sense amplifier 74 to bit lines 24 and 26 to couple the sense amplifier 74 as a differential sense amplifier reading a differential bit stored in memory cell pair 36 and 38 in the first row of the array or a differential bit stored in memory cell pair 48 and 50 in the second row of the array.

Persons of ordinary skill in the art will recognize the term "differential bit" or "complementary bit" to mean a bit that is stored in a pair of memory cells. One memory cell stores the bit and the other cell stores its complement. In the context of the present invention, an example would be to store a bit having a value of logic "1" by storing a logic "1" value in one memory cell and storing a logic "0" value in the complementary memory cell. Because the signal is twice as large as a signal from single ended cells that is compared against a reference voltage that is set somewhere between the voltage generated on the bit line for a logic "1" value and the voltage generated on the bit line for a logic "0" value, and because noise components become common mode noise in a differential sense amplifier, "weak" memory cells are more reliably sensed.

The control gates of memory transistors $52_{xx}$ in each row of the array are coupled to a gate line. The control gates of memory transistors $52_{00}$, $52_{01}$, $52_{02}$, $52_{03}$, $52_{04}$, and $52_{05}$ in the first row of the array are coupled together to a control gate line 82, and the control gates of memory transistors $52_{10}$, $52_{11}$, $52_{12}$, $52_{13}$, $52_{14}$, and $52_{15}$ in the second row of the array are coupled together to a control gate line 84. Control gate lines 82 and 84 are used for programming the memory transistors as will be readily understood by persons of ordinary skill in the art.

The bit lines 16, 18, 2, 22, 24, and 26 in memory array 10 are shown coupled to the sense amplifiers through multiplexers. Bit line 16 is coupled to the first input of sense amplifier 56 through switch 58 via multiplexer $86_0$. Bit line 18 is coupled to the second input of sense amplifier 56 through switch 60 via multiplexer $86_1$. Bit line 20 is coupled to the first input of sense amplifier 66 through switch 68 via multiplexer $86_2$. Bit line 22 is coupled to the second input of sense amplifier 66 through switch 70 via multiplexer $86_3$. Bit line 24 is coupled to the first input of sense amplifier 74 through switch 76 via multiplexer $86_4$. Bit line 26 is coupled to the second input of sense amplifier 74 through switch 78 via multiplexer $86_5$.

Multiplexers $86_0$, $86_1$, $86_2$, $86_3$, $86_4$, and $86_5$ are used to multiplex more than one group of bit lines to the sense amplifiers as is well known in the art so that groups of memory cells (e.g., 64 memory cells) can be read using the same set of sense amplifiers. The illustrative embodiment shown in FIG. 1 shows six columns of memory cells $BL_0$ through $BL_5$ for purposes of illustration. The other inputs of the multiplexers will be coupled to other groups of bit lines (e.g., in an arrangement having memory cells arranged in groups of 64, the first data inputs to the multiplexers will be coupled to bit lines $BL_0$ through $BL_{63}$, the second data input of each multiplexer will be coupled to bit lines $BL_{64}$ through $BL_{127}$ and so on). Multiplexers $86_0$, $86_1$, $86_2$, $86_3$, $86_4$, and $86_5$ are also shown in all of FIGS. 2A, 2B, 3A, 3B, 4A, and 4B and operate the same manner as described above for a typical memory array. Repetition of the use of these multiplexers will not be described with reference to the other drawing figures to avoid unnecessary repetition.

Figure 2A:
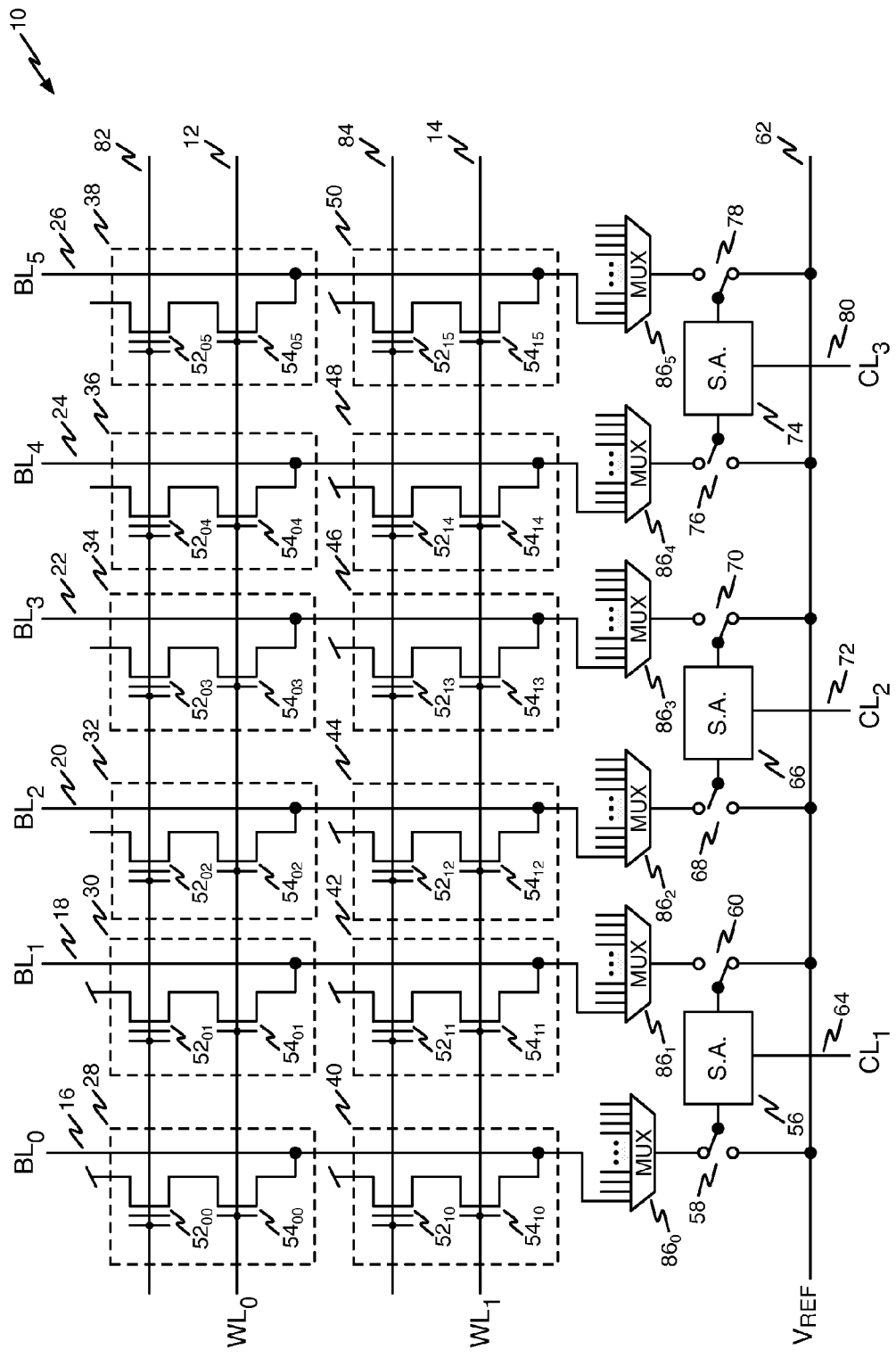
FIG. 2A is a diagram of the memory array of FIG. 1 in a single-ended configuration for commercial applications configured for reading data from a first column in a pair of columns.

Referring now to FIG. 2A, the memory array 10 of FIG. 1 is shown configured as a commercial product and the switches are set to read data from the memory cells in the odd columns from bit lines 16, 20 and 24. Switch 58 is set to connect the first input of the sense amplifier 56 to bit line 16. Switch 60 is set to connect the second input of sense amplifier 56 to the reference voltage line 62. Sense amplifier 56 is now configured to read a single-ended bit stored in memory cell 28 in the first row of the array and memory cell 40 in the second row of the array.

Switch 68 is set to connect the first input of the sense amplifier 66 to bit line 20. Switch 60 is set to connect the second input of sense amplifier 66 to the reference voltage line 62. Sense amplifier 66 is now configured to read a single-ended bit stored in memory cell 32 in the first row of the array and memory cell 44 in the second row of the array.

Switch 76 is set to connect the first input of the sense amplifier 74 to bit line 24. Switch 78 is set to connect the second input of sense amplifier 74 to the reference voltage line 62. Sense amplifier 74 is now configured to read a single-ended bit stored in memory cell 36 in the first row of the array and memory cell 48 in the second row of the array.

Figure 2B:
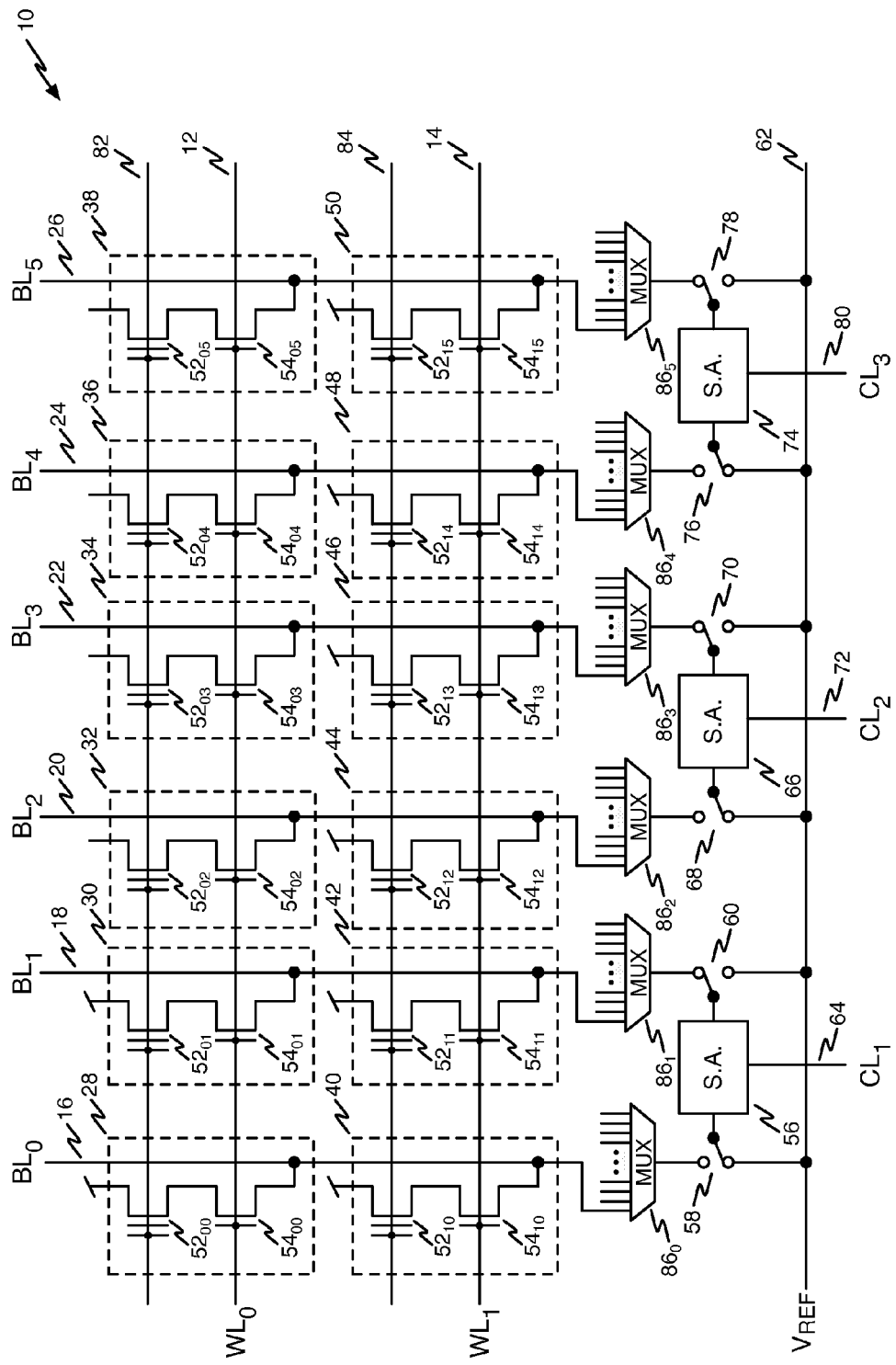
FIG. 2B is a diagram of the memory array of FIG. 1 in a single-ended configuration for commercial applications configured for reading data from a second column in a pair of columns.

Referring now to FIG. 2B, the memory array 10 of FIG. 1 is shown configured as a commercial product and the switches are set to read data from the memory cells in the even columns from bit lines 18, 22 and 26. Switch 58 is set to connect the first input of the sense amplifier 56 to the reference voltage line 62. Switch 60 is set to connect the second input of sense amplifier 56 to bit line 18. Sense amplifier 56 is now configured to read a single-ended bit stored in memory cell 30 in the first row of the array and memory cell 42 in the second row of the array.

Switch 68 is set to connect the first input of the sense amplifier 66 to the reference voltage line 62. Switch 60 is set to connect the second input of sense amplifier 66 to bit line 22. Sense amplifier 66 is now configured to read a single-ended bit stored in memory cell 34 in the first row of the array and memory cell 46 in the second row of the array.

Switch 76 is set to connect the first input of the sense amplifier 74 to the reference voltage line 62. Switch 78 is set to connect the second input of sense amplifier 74 to bit line 26. Sense amplifier 74 is now configured to read a single-ended bit stored in memory cell 38 in the first row of the array and memory cell 50 in the second row of the array.

Persons of ordinary skill in the art will appreciate that the configuration of FIG. 2A reads the data out of the first column in each column pair (columns 16, 20, and 24) of the array 10 and that the configuration of FIG. 2B is used to read the data out of the second column in each pair (columns 18, 22, and 26) of the array 10. A simple switch control circuit (not shown) is used to toggle the array 10 between the states shown in FIGS. 2A and 2B by changing the states of switches 58, 60, 68, 70, 76, and 78. Such skilled persons will note that the inputs to the differential sense amplifiers 56, 66, and 74 are reversed in polarity between the two configurations shown in FIGS. 2A and 2B and that the logic level stored in one of the pairs of columns of memory cells will have to be inverted or that the circuitry reading the data will have to invert the output of the sensed data from one of the columns in each pair to compensate for the reversed polarity of the sense amplifiers 56, 66, and 74.

Persons of ordinary skill in the art will observe that the non-volatile memory cells of the arrays 10 of the present invention shown in FIGS. 1, 2A and 2B are laid out in conventional rows and columns. This does not differ whether memory cell array is configured as a complimentary (differential) memory cell or a single-ended memory cell. To convert a design from single-ended to a differential memory cell merely requires a switching system for a differential sense amplifier, such as the exemplary one shown in the figures.

Figure 3A:
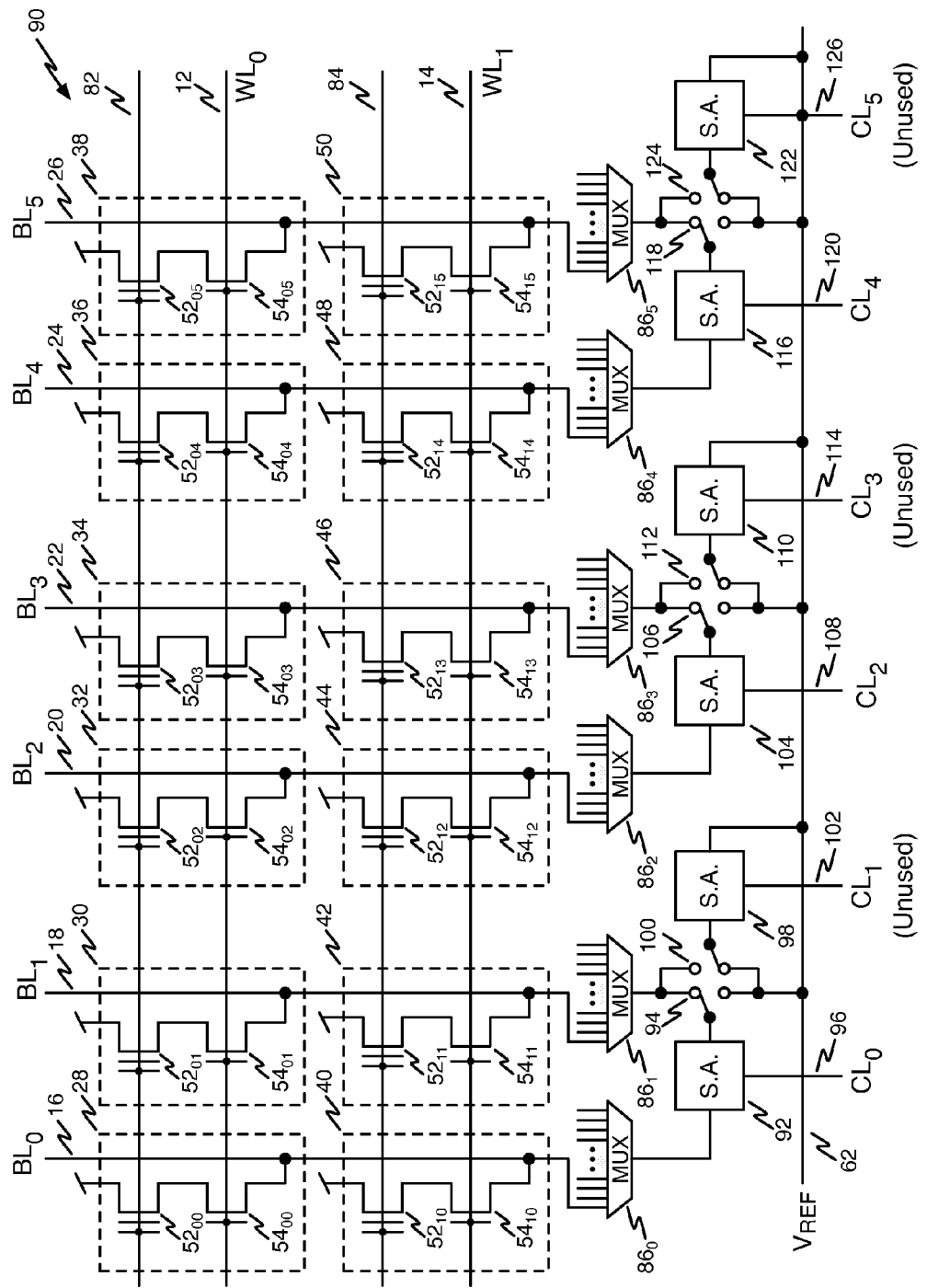
FIG. 3A is a diagram of another illustrative embodiment of a memory-array architecture according to one aspect of the present invention configured differentially for high-reliability applications.

Referring now to FIG. 3A, a diagram shows another illustrative embodiment of a memory-array architecture according to one aspect of the present invention configured differentially for high-reliability applications. Memory array 90 is substantially similar to memory array 10 of FIGS. 1, 2A and 2B in that array 90 is configured as a plurality of rows and columns with a memory cell at the intersection of each row and column. Persons of ordinary skill in the art will appreciate that two rows and six columns are shown in FIG. 3A for purposes of illustrating the invention, and memory arrays of arbitrary size are contemplated in accordance with the invention.

A first word line ($WL_0$) 12 is associated with a first row of the array and a second word line ($WL_1$) 14 is associated with a second row of the array. A first bit line ($BL_0$) 16 is associated with a first column of the array. A second bit line ($BL_1$) 18 is associated with a second column of the array. A third bit line ($BL_2$) 20 is associated with a third column of the array. A fourth bit line ($BL_3$) 22 is associated with a fourth column of the array. A fifth bit line ($BL_4$) 24 is associated with a fifth column of the array. A sixth bit line ($BL_5$) 26 is associated with a sixth column of the array.

A memory cell is disposed at each row and column intersection. The first row of the array includes memory cells 28, 30, 32, 34, 36, and 38. The second row of the array includes memory cells 40, 42, 44, 46, 48, and 50. The first column of the array includes memory cells 28 and 40; the second column of the array includes memory cells 30 and 42; the third column of the array includes memory cells 32 and 44; the fourth column of the array includes memory cells 34 and 46; the fifth column of the array includes memory cells 36 and 48 and the sixth column of the array includes memory cells 38 and 50.

Each memory cell includes a pair of NMOS transistors. A first transistor $52_{XY}$ (where X and Y denote the row and column position) is a non-volatile transistor having its drain coupled to $V_{DD}$. The first transistor is connected in series with a volatile NMOS select transistor $54_{XY}$ (where X and Y denote the row and column position) having its drain coupled to the source of the non-volatile transistor $52_{XY}$, its source coupled to the bit line of the column with which it is associated and its gate coupled to the word line of the row with which it is associated.

A differential sense amplifier 92 is associated with the first two columns in the array. The first input of the sense amplifier 92 is coupled to bit line 16. The second input of the sense amplifier 92 is coupled to a switch 94 that can connect the second input to the bit line 18 or to the reference voltage line 62. The output of the sense amplifier 92 drives a column output line ($CL_0$) 96.

A differential sense amplifier 98 is associated with the second column in the array. The first input of the sense amplifier 100 is coupled to a switch 100 that can connect the first input of the sense amplifier 100 to the bit line 18 or to the reference voltage line 62. The second input of the sense amplifier 98 is coupled to the reference voltage line 62. The output of the sense amplifier 98 drives a column output line ($CL_1$) 102.

Similarly, a differential sense amplifier 104 is associated with the third and fourth columns in the array. The first input of the sense amplifier 104 is coupled to bit line 20. The second input of the sense amplifier 104 is coupled to a switch 106 that can connect the second input of the sense amplifier 104 to the bit line 22 or to the reference voltage line 62. The output of the sense amplifier 104 drives a column output line ($CL_2$) 108.

A differential sense amplifier 110 is associated with the fourth column in the array. The first input of the sense amplifier 110 is coupled to a switch 112 that can connect the first input of the sense amplifier 110 to the bit line 22 or to the reference voltage line 62. The second input of the sense amplifier 110 is coupled to the reference voltage line 62. The output of the sense amplifier 110 drives a column output line ($CL_3$) 114.

A differential sense amplifier 116 is associated with the fifth and sixth columns in the array. The first input of the sense amplifier 116 is coupled to bit line 24. The second input of the sense amplifier 116 is coupled to a switch 118 that can connect the second input to the bit line 26 or to the reference voltage line 62. The output of the sense amplifier 116 drives a column output line ($CL_4$) 120.

A differential sense amplifier 122 is associated with the sixth column in the array. The first input of the sense amplifier 122 is coupled to bit line 26. The second input of the sense amplifier 122 is coupled to the reference voltage line 62. The output of the sense amplifier 122 drives a column output line ($CL_5$) 126.

The memory array of FIG. 3A is shown configured as a high-reliability memory array. Switch 94 is set to connect the second input of the sense amplifier 92 to bit line 18 to couple the sense amplifier 92 as a differential sense amplifier reading a differential bit stored in memory cell pair 28 and 30 in the first row of the array or reading a differential bit stored in memory cell pair 40 and 42 in the second row of the array. The output of sense amplifier 92 appears on column output line ($CL_0$) 96.

Switch 106 is set to connect the second input of the sense amplifier 104 to bit line 22 to couple the sense amplifier 104 as a differential sense amplifier reading a differential bit stored in memory cell pair 32 and 34 in the first row of the array or reading a differential bit stored in memory cell pair 44 and 46 in the second row of the array. The output of sense amplifier 104 appears on column output line ($CL_2$) 108.

Switch 118 is set to connect the second input of the sense amplifier 116 to bit line 26 to couple the sense amplifier 116 as a differential sense amplifier reading a differential bit stored in memory cell pair 36 and 38 in the first row of the array or memory cell pair 48 and 50 in the second row of the array. The output of sense amplifier 116 appears on column output line ($CL_4$) 120.

In the configuration of memory array 90 shown in FIG. 3A, switch 100 connects the first input of sense amplifier 98 to the reference voltage line 62. Similarly, switch 112 connects the first input of sense amplifier 110 to the reference voltage line 62 and switch 124 connects the first input of sense amplifier 122 to the reference voltage line 62. Consequently, there is no memory output on column output lines ($CL_1$) 102, ($CL_3$) 114, and ($CL_5$) 126 in this configuration.

Figure 3B:
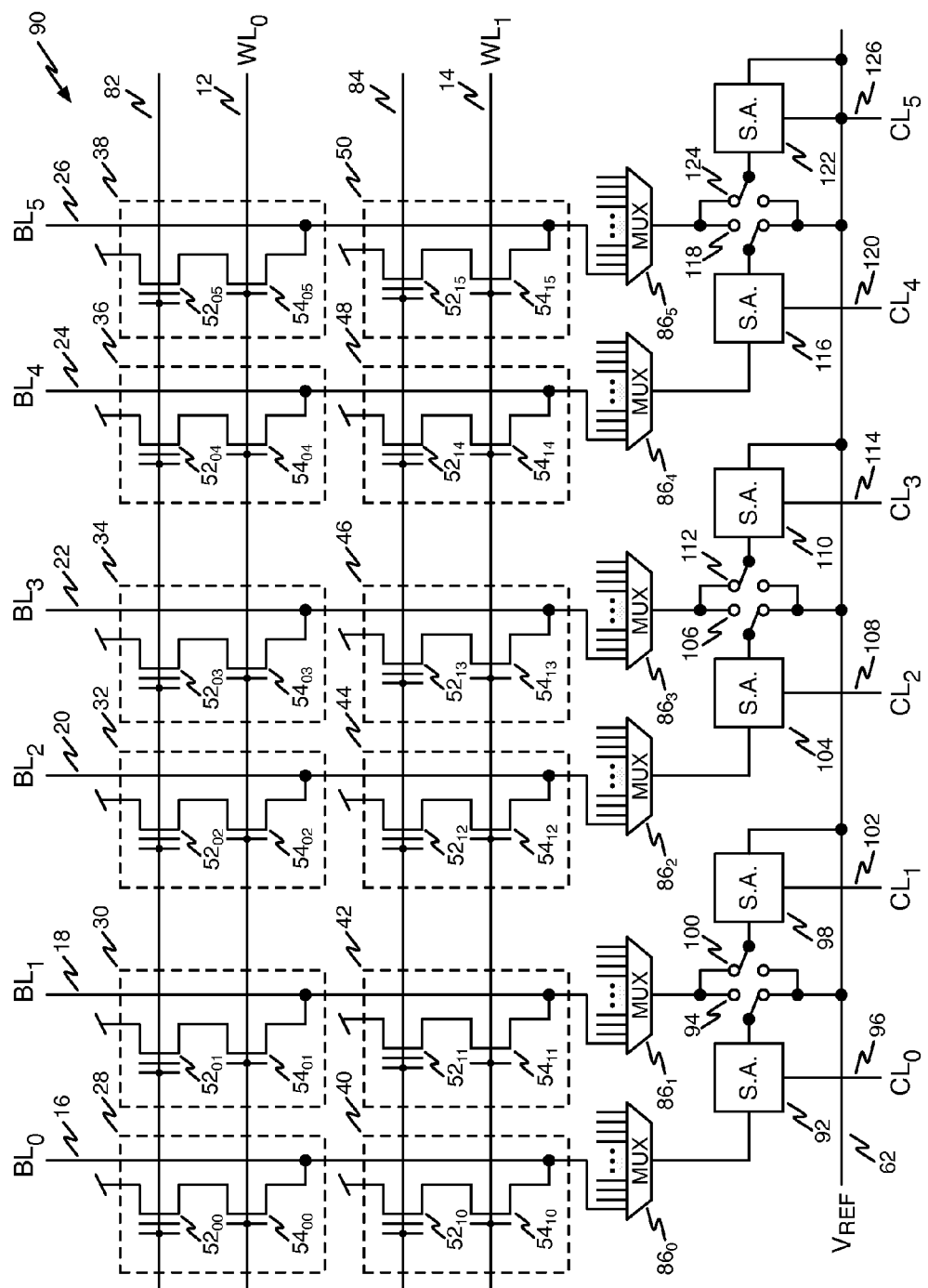
FIG. 3B is a diagram of the memory array of FIG. 3A in a single-ended configuration for commercial applications.

Referring now to FIG. 3B, a diagram shows the memory array 90 of FIG. 3A configured in a single-ended configuration for commercial applications. Switch 94 is set to connect the second input of the sense amplifier 92 to the reference voltage line 62 to couple the sense amplifier 92 as a single-ended sense amplifier comparing a single bit stored in memory cell 28 in the first row of the array or memory cell 40 in the second row of the array against the reference voltage. The output of sense amplifier 92 appears on column output line ($CL_0$) 96.

Switch 106 is set to connect the second input of the sense amplifier 104 to the reference voltage line 62 to couple the sense amplifier 104 as a single-ended sense amplifier comparing a single bit stored in memory cell 32 in the first row of the array or memory cell 44 in the second row of the array against the reference voltage. The output of sense amplifier 104 appears on column output line ($CL_2$) 108.

Switch 118 is set to connect the second input of the sense amplifier 116 to the reference voltage line 62 to couple the sense amplifier 118 as a single-ended sense amplifier comparing a single bit stored in memory cell 36 in the first row of the array or memory cell 48 in the second row of the array against the reference voltage. The output of sense amplifier 116 appears on column output line (CL$_4$) 120.

In the configuration of memory array 90 shown in FIG. 3B, switch 100 is set to connect the first input of sense amplifier 98 to bit line 18 to couple the sense amplifier 98 as a single-ended sense amplifier comparing a single bit stored in memory cell 30 in the first row of the array or memory cell 42 in the second row of the array against the reference voltage. The output of sense amplifier 98 appears on column output line (CL$_1$) 102.

Similarly, switch 112 is set to connect the first input of sense amplifier 110 to bit line 22 to couple the sense amplifier 110 as a single-ended sense amplifier comparing a single bit stored in memory cell 34 in the first row of the array or memory cell 46 in the second row of the array against the reference voltage. The output of sense amplifier 110 appears on column output line (CL$_3$) 114.

Switch 124 is set to connect the first input of sense amplifier 122 to bit line 26 to couple the sense amplifier 122 as a single-ended sense amplifier comparing a single bit stored in memory cell 38 in the first row of the array or memory cell 50 in the second row of the array against the reference voltage. The output of sense amplifier 122 appears on column output line (CL$_5$) 126.

As will be appreciated by persons of ordinary skill in the art, different sense amplifiers may be employed in the present invention. A differential sense amplifier is shown switched between a reference line and an additional bit line column. Another approach would be to employ two sense amplifier designs and to use a pass gate controlled by an element such as a flip-flop or non-volatile element to switch in the desired one.

Figure 4A:
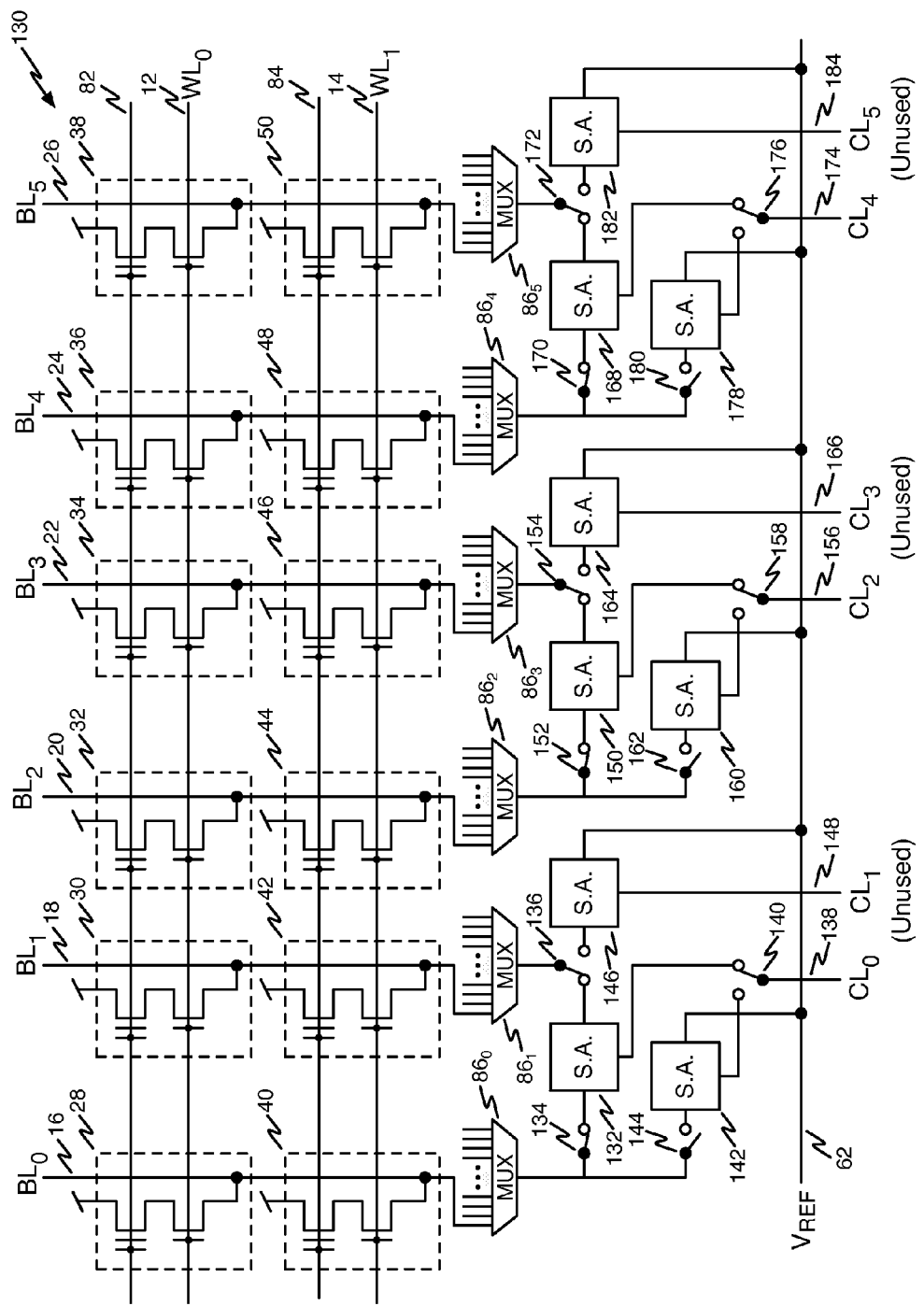
FIG. 4A is a diagram of another illustrative embodiment of a memory-array architecture according to one aspect of the present invention configured differentially for high-reliability applications.
Figure 4B:
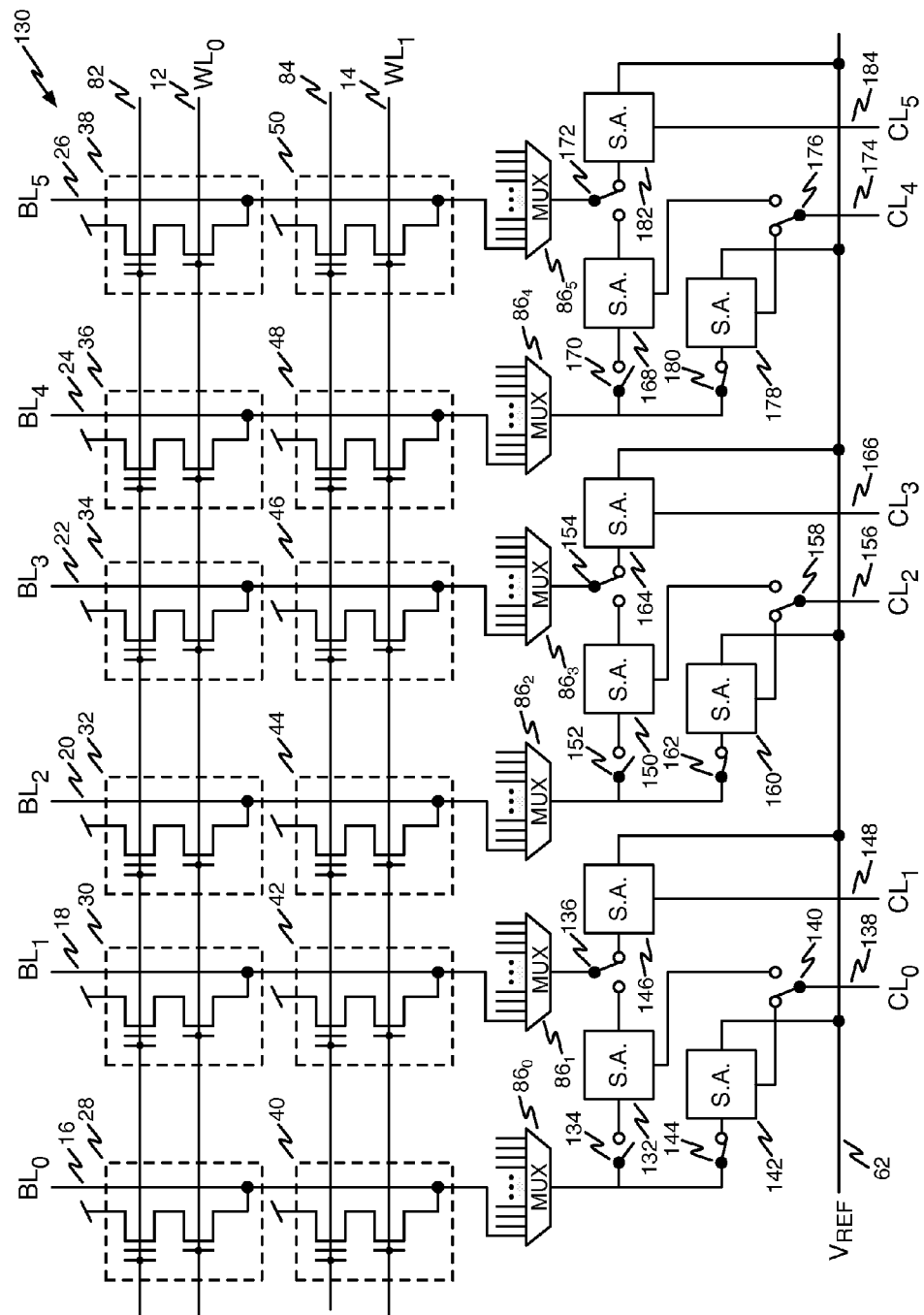
FIG. 4B is a diagram of the memory array of FIG. 4A in a single-ended configuration for commercial applications.

Referring now to FIGS. 4A and 4B such an embodiment of the present invention is shown. The embodiment of FIGS. 4A and 4B employs two different sense amplifier designs that may be switched into the circuit depending on whether a high-reliability or commercial version of the memory array is needed.

Referring now to FIG. 4A, a diagram shows another illustrative embodiment of a memory-array architecture according to one aspect of the present invention configured differentially for high-reliability applications. Memory array 130 is also substantially similar to memory arrays depicted in the prior figures that array 130 is configured as a plurality of rows and columns with a memory cell at the intersection of each row and column. Persons of ordinary skill in the art will appreciate that two rows and six columns are shown in FIG. 4A for purposes of illustrating the invention, and memory arrays of arbitrary size are contemplated in accordance with the invention.

A first word line (WL$_0$) 12 is associated with a first row of the array and a second word line (WL$_1$) 14 is associated with a second row of the array. A first bit line (BL$_0$) 16 is associated with a first column of the array. A second bit line (BL$_1$) 18 is associated with a second column of the array. A third bit line (BL$_2$) 20 is associated with a third column of the array. A fourth bit line (BL$_3$) 22 is associated with a fourth column of the array. A fifth bit line (BL$_4$) 24 is associated with a fifth column of the array. A sixth bit line (BL$_5$) 26 is associated with a sixth column of the array.

A memory cell is disposed at each row and column intersection. The first row of the array includes memory cells 28, 30, 32, 34, 36, and 38. The second row of the array includes memory cells 40, 42, 44, 46, 48, and 50. The first column of the array includes memory cells 28 and 40; the second column of the array includes memory cells 30 and 42; the third column of the array includes memory cells 32 and 44; the fourth column of the array includes memory cells 34 and 46; the fifth column of the array includes memory cells 36 and 48 and the sixth column of the array includes memory cells 38 and 50.

As in the prior embodiments, each memory cell includes a pair of NMOS transistors including a non-volatile memory transistor and a select transistor. The non-volatile transistor has its drain coupled to V$_{DD}$ and is connected in series with a volatile NMOS select transistor having its drain coupled to the source of the non-volatile transistor, its source coupled to the bit line of the column with which it is associated and its gate coupled to the word line of the row with which it is associated.

A differential sense amplifier 132 is associated with the first two columns in the array. The first input of the sense amplifier 132 is coupled to bit line 16 through a switch 134. The second input of the sense amplifier 132 is coupled to bit line 18 through a switch 136. The output of the sense amplifier 132 drives a column output line (CL$_0$) 136 through a switch 140.

A sense amplifier 142 is associated with the first column in the array. The first input of the sense amplifier 142 is coupled to bit line 16 through a switch 144. The second input of the sense amplifier 142 is coupled to the reference voltage line 62. The output of the sense amplifier 142 drives the column output line (CL$_0$) 138 through switch 140.

A sense amplifier 146 is associated with the second column in the array. The first input of the sense amplifier 146 is coupled to bit line 18 through switch 136. The second input of the sense amplifier 146 is coupled to the reference voltage line 62. The output of the sense amplifier 146 drives the column output line (CL$_1$) 148.

Similarly, differential sense amplifier 150 is associated with the third and fourth columns in the array. The first input of the sense amplifier 150 is coupled to bit line 20 through a switch 152. The second input of the sense amplifier 150 is coupled to bit line 22 through a switch 154. The output of the sense amplifier 150 drives a column output line (CL$_2$) 156 through a switch 158.

A sense amplifier 160 is associated with the third column in the array. The first input of the sense amplifier 160 is coupled to bit line 20 through a switch 162. The second input of the sense amplifier 160 is coupled to the reference voltage line 62. The output of the sense amplifier 160 drives the column output line (CL$_2$) 138 through switch 158.

A sense amplifier 164 is associated with the fourth column in the array. The first input of the sense amplifier 164 is coupled to bit line 22 through switch 154. The second input of the sense amplifier 164 is coupled to the reference voltage line 62. The output of the sense amplifier 164 drives the column output line (CL$_3$) 148.

A differential sense amplifier 168 is associated with the fifth and sixth columns in the array. The first input of the sense amplifier 168 is coupled to bit line 24 through a switch 170. The second input of the sense amplifier 168 is coupled to bit line 26 through a switch 172. The output of the sense amplifier 168 drives a column output line (CL$_4$) 174 through a switch 176.

A sense amplifier 178 is associated with the fifth column in the array. The first input of the sense amplifier 178 is coupled to bit line 24 through a switch 180. The second input of the sense amplifier 178 is coupled to the reference voltage line 62. The output of the sense amplifier 178 drives the column output line (CL$_4$) 174 through switch 176.

A sense amplifier 182 is associated with the sixth column in the array. The first input of the sense amplifier 182 is coupled to bit line 26 through switch 172. The second input of the sense amplifier 182 is coupled to the reference voltage line 62. The output of the sense amplifier 182 drives the column output line (CL$_5$) 184.

The memory array of FIG. 4A is shown configured as a high-reliability memory array. Switches 134 and 136 are set to connect the first and second inputs of the sense amplifier 132 to bit lines 16 and 18, respectively. Sense amplifier 132 operates as a differential sense amplifier reading a differential bit stored in memory cell pair 28 and 30 in the first row of the array or reading a differential bit stored in memory cell pair 40 and 42 in the second row of the array appearing on bit lines 16 and 18. The output of sense amplifier 132 appears on column output line (CL$_0$) 138.

Similarly, switches 152 and 154 are set to connect the first and second inputs of the sense amplifier 150 to bit lines 20 and 22, respectively. Sense amplifier 150 operates as a differential sense amplifier reading a differential bit stored in memory cell pair 32 and 34 in the first row of the array or reading a differential bit stored in memory cell pair 44 and 46 in the second row of the array appearing on bit lines 20 and 22. The output of sense amplifier 150 appears on column output line (CL$_2$) 156.

Switches 170 and 172 are set to connect the first and second inputs of the sense amplifier 168 to bit lines 24 and 26, respectively. Sense amplifier 168 operates as a differential sense amplifier reading a differential bit stored in memory cell pair 36 and 38 in the first row of the array or reading a differential bit stored in memory cell pair 48 and 50 in the second row of the array appearing on bit lines 24 and 26. The output of sense amplifier 168 appears on column output line (CL$_4$) 174.

In the configuration of memory array 130 shown in FIG. 4A, the first input of sense amplifier 146 is not connected to bit line 18. Similarly, the first inputs of sense amplifiers 164 and 182 are not connected to bit lines 22 and 26, respectively. Consequently, there is no memory output on column output lines (CL$_1$) 148, (CL$_3$) 166, and (CL$_5$) 184 in this configuration.

Referring now to FIG. 4B, a diagram shows the memory array 130 of FIG. 4A configured in a single-ended configuration, which is adequate for commercial applications. Switch 134 is opened, disconnecting the first input of differential sense amplifier 132 from bit line 16, and switch 136 disconnects bit line 18 from the second input of differential sense amplifier 132 and connects it to the first input of sense amplifier 146. Switch 144 is closed, connecting bit line 16 to the first input of sense amplifier 142. Switch 152 is opened, disconnecting the first input of differential sense amplifier 150 from bit line 20, and switch 154 disconnects bit line 22 from the second input of differential sense amplifier 150 and connects it to the first input of sense amplifier 164. Switch 162 is closed, connecting bit line 20 to the first input of sense amplifier 160. Switch 170 is opened, disconnecting the first input of differential sense amplifier 168 from bit line 24, and switch 172 disconnects bit line 26 from the second input of differential sense amplifier 168 and connects it to the first input of sense amplifier 182. Switch 180 is closed, connecting bit line 24 to the first input of sense amplifier 178.

In the configuration of memory array 130 shown in FIG. 4B, differential sense amplifiers 132, 150, and 168 are disconnected from the bit lines and the column output lines. Sense amplifiers 142, 146, 160, 164, 178, and 182 are connected to the bit lines 16, 18, 20, 22, 24, and 26, respectively, and to the column output lines 138, 148, 156, 166, 174, and 184, respectively. Instead of differentially sensing the voltage between adjacent pair of bit lines, sense amplifiers 142, 146, 160, 164, 178, and 182 each compare the voltage at their respective bit lines with the reference voltage on line 62 and may be designed differently from differential sense amplifiers 132, 150, and 168 as is well known in the memory sensing art.

Figure 5A:
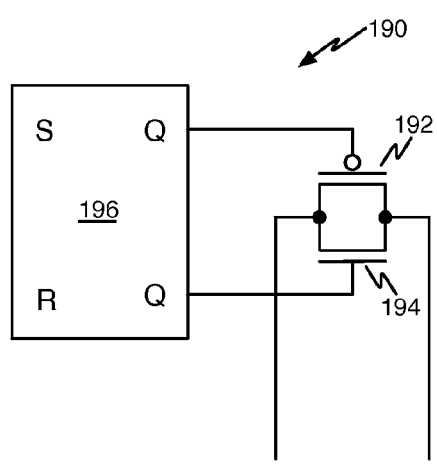
FIGS. 5A and 5B are diagrams showing illustrative circuitry for implementing sense amplifier switches according to the present invention.
Figure 5B:
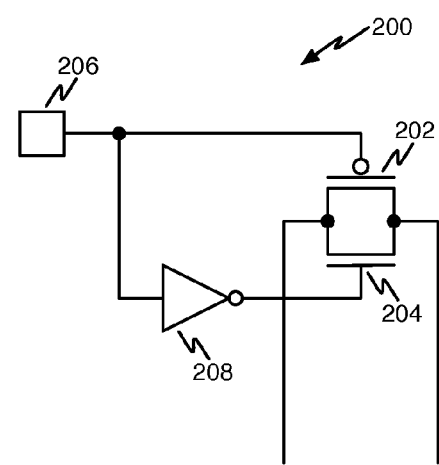

Referring now to FIGS. 5A and 5B, diagrams show illustrative circuitry for implementing sense amplifier switches according to the present invention. Referring now to FIG. 5A, a first illustrative circuit 190 for implementing and controlling the sense amplifier switches is shown. P-channel MOS transistor 192 and N-channel MOS transistor 194 are configured as a pass gate as is known in the art. Flip-flop 196 has its Q output coupled to the gate of P-channel MOS transistor 192 and its Q! output coupled to the gate of N-channel MOS transistor 194. Flip-flop 196 can be controlled using its set and reset inputs as is known in the art and may be controlled by programmed circuitry in an integrated circuit such as an FPGA.

Referring now to FIG. 5B, a second illustrative circuit 200 for implementing and controlling the sense amplifier switches is shown. P-channel MOS transistor 202 and N-channel MOS transistor 204 are configured as a pass gate as is known in the art. The pass gate is controlled by non-volatile memory bit 196. The gate of P-channel MOS transistor 192 is coupled directly to the non-volatile memory bit 206 and the gate of N-channel MOS transistor 204 is coupled to the non-volatile memory bit 206 through inverter 208.

Persons of ordinary skill in the art will appreciate that the circuits shown in FIGS. 5A and 5B are illustrative only and that other known circuits can be used to implement and control the switches.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a non-volatile memory array arranged as a plurality of rows and columns of non-volatile memory cells, memory cells in each column of the array being selectively coupleable to a bit line associated with that column of the array, a memory cell sensing circuit comprising:
   a first sense amplifier arrangement coupleable to the memory array to differentially read a complementary bit stored in a pair of memory cells; and
   a second sense amplifier arrangement coupleable to the memory array to read a single-ended bit stored in a single memory cell;
   wherein the first and second sense amplifier arrangements are selectively coupled to the memory array in response to at least one selection signal.

2. The memory cell sensing circuit of claim 1 wherein the first sense amplifier arrangement comprises a first sense amplifier having a first input coupled to a first bit line and a second input coupled to a second bit line in response to a first state of the at least one selection signal.

3. The memory cell sensing circuit of claim 1 wherein the second sense amplifier arrangement comprises:
   a first sense amplifier having a first input coupled to a first bit line and a second input coupled to a reference voltage in response to a second state of the at least one selection signal; and
   a second sense amplifier having a first input coupled to a second bit line and a second input coupled to the reference voltage in response to the second state of the at least one selection signal.

4. The memory cell sensing circuit of claim 2 wherein the second sense amplifier arrangement comprises:
- the first sense amplifier having the first input coupled to the first bit line and the second input coupled to a reference voltage the second state of the at least one selection signal; and
- a second sense amplifier having a first input coupled to the second bit line and a second input coupled to the reference voltage in response to the second state of the at least one selection signal.

5. The memory cell sensing circuit of claim 1 wherein:
- the first sense amplifier arrangement comprises a first sense amplifier coupleable to the memory array, said first sense amplifier having a first input coupled to a first bit line and a second input coupled to a second bit line, said first sense amplifier arrangement operative to differentially read a complementary bit stored in a pair of memory cells in response to a first state of the at least one selection signal; and
- the second sense amplifier arrangement comprises a second sense amplifier having a first input coupled to the first bit line and a second input coupled to the reference voltage, and a third sense amplifier having a first input coupled to the second bit line and a second input coupled to the reference voltage in response to the second state of the at least one selection signal.

6. The memory cell sensing circuit of claim 1 wherein:
- the first sense amplifier arrangement comprises a first sense amplifier having a first input coupled to a first bit line and a second input coupled to a second bit line in response to a first state of the at least one selection signal; and
- the second sense amplifier arrangement comprises the first sense amplifier having the first input coupled to the first bit line and the second input coupled to a reference voltage for a first period of time, and the first sense amplifier having the first input coupled to the reference voltage and the second input coupled to the second bit line for a second period of time in response to a second state of the at least one selection signal.

7. In a non-volatile memory array arranged as a plurality of rows and columns of non-volatile memory cells, memory cells in each column of the array being selectively coupleable to a bit line associated with that column of the array, a sense amplifier arrangement including:
- a sense amplifier having a first input and a second input; and
- a switching circuit configured to selectively:
  - couple the first input of the sense amplifier to a first bit line in the array and the second input of the sense amplifier to a second bit line in the array;
  - couple the first input of the sense amplifier to the first bit line in the array and the second input of the sense amplifier to a reference voltage; or
  - couple the second input of the sense amplifier to the second bit line in the array and the first input of the sense amplifier to the reference voltage.

8. In a non-volatile memory array arranged as a plurality of rows and columns of non-volatile memory cells, memory cells in each column of the array being selectively coupleable to a bit line associated with that column of the array, a sense amplifier arrangement including:
- a first sense amplifier having a first input and a second input;
- a second sense amplifier having a first input and a second input, the second input coupled to a reference voltage; and
- a switching circuit configured to selectively:
  - couple the first input of the first sense amplifier to a first bit line in the array and the second input of the first sense amplifier to a second bit line in the array; or
  - couple the first input of the first sense amplifier to the first bit line in the array, the first input of the second sense amplifier to the second bit line in the array, and the second input of the first sense amplifier to the reference voltage.

9. In a non-volatile memory array arranged as a plurality of rows and columns of non-volatile memory cells, memory cells in each column of the array being selectively coupleable to a bit line associated with that column of the array, a sense amplifier arrangement including:
- a first sense amplifier having a first input and a second input;
- a second sense amplifier having a first input and a second input, the second input of the second sense amplifier coupled to a reference voltage;
- a third sense amplifier having a first input and a second input, the second input of the third sense amplifier coupled to a reference voltage; and
- a switching circuit configured to selectively:
  - couple the first input of the first sense amplifier to a first bit line in the array and the second input of the first sense amplifier to a second bit line in the array, or
  - couple the first input of the second sense amplifier to the first bit line in the array, and the first input of the third sense amplifier to the second bit line in the array.

10. A method for operating a non-volatile memory including a pair of memory cells in a row and associated with two adjacent columns in the array, the method comprising:
- selecting a first mode of operation;
- if the first mode of operation is selected:
- programming the pair of memory cells with complementary data as a single bit;
- coupling the bit line associated with the first column of the adjacent pair of columns to the first input of a sense amplifier and coupling the bit line associated with the second column of the adjacent pair of columns to the second input of the sense amplifier; and
- asserting the word line for the row thus reading the programmed complementary data out to the sense amplifier on the bit lines associated with the adjacent columns;
- if the second mode of operation is selected:
- programming the pair of memory cells individually with data;
- coupling the bit line associated with the first column of the two adjacent columns to the first input of a sense amplifier and coupling a reference voltage to the second input of the sense amplifier;
- asserting the word line for the row thus reading the programmed data from the memory cell in the first column out to the sense amplifier;
- coupling the reference voltage to the first input of the sense amplifier and coupling the bit line associated with the second column of the two adjacent columns to the second input of a sense amplifier; and
- asserting the word line for the row thus reading the programmed data from the memory cell in the second column out to the sense amplifier.

11. A method for operating a non-volatile memory including a pair of memory cells in a row and associated with two adjacent columns in the array, the method comprising:
- selecting between a first mode of operation and a second mode of operation;

if the first mode of operation is selected:
programming the pair of memory cells with complementary data as a single bit;
coupling the bit line associated with the first column of the adjacent pair of columns to the first input of a first sense amplifier and coupling the bit line associated with the second column of the adjacent pair of columns to the second input of the first sense amplifier; and
asserting the word line for the row and reading the complementary data read out to the sense amplifier on the bit lines associated with the adjacent columns, if the second mode of operation is selected:
programming the pair of memory cells individually with data;
coupling the bit line associated with the first column of the two adjacent columns to the first input of the first sense amplifier and a reference voltage to the second input of the first sense amplifier;
coupling the bit line associated with the second column of the two adjacent columns to a first input of a second sense amplifier; and
asserting the word line for the row thus reading the data from the memory cell in the first column out to the first sense amplifier and reading the data from the memory cell in the second column out to the second sense amplifier.

12. A method for operating a non-volatile memory including a pair of memory cells in a row and associated with two adjacent columns in the array, the method comprising:
selecting between a first mode of operation and a second mode of operation;
if the first mode of operation is selected:
programming the pair of memory cells with complementary data as a single bit;
coupling the bit line associated with the first column of the adjacent pair of columns to the first input of a first sense amplifier and coupling the bit line associated with the second column of the adjacent pair of columns to the second input of the first sense amplifier; and
asserting the word line for the row thus reading the programmed complementary data out to the sense amplifier on the bit lines associated with the adjacent columns, if the second mode of operation is selected:
programming the pair of memory cells individually with data;
coupling the bit line associated with the first column of the two adjacent columns to the first input of a second sense amplifier and a reference voltage to the second input of the second sense amplifier;
coupling the bit line associated with the second column of the two adjacent columns to a first input of a third sense amplifier and a reference voltage to the second input of the third sense amplifier; and
asserting the word line for the row thus reading the data from the memory cell in the first column out to the second sense amplifier and reading the data from the memory cell in the second column out to the third sense amplifier.

* * * * *